(12) United States Patent
Kim et al.

(10) Patent No.: US 9,470,829 B2
(45) Date of Patent: Oct. 18, 2016

(54) POLARIZING PLATE, TFT SUBSTRATE INCLUDING THE POLARIZING PLATE, AND METHOD OF MANUFACTURING THE POLARIZING PLATE

(71) Applicant: Samsung Display Co., Ltd., Yongin (KR)

(72) Inventors: Tae Woo Kim, Seoul (KR); Seung Won Park, Seoul (KR); Lei Xie, Suwon-si (KR); Dae ho Yoon, Seoul (KR); Moon Gyu Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/691,216

(22) Filed: Apr. 20, 2015

(65) Prior Publication Data

US 2016/0170116 A1 Jun. 16, 2016

(30) Foreign Application Priority Data

Dec. 10, 2014 (KR) .................. 10-2014-0177458

(51) Int. Cl.
*G02B 5/30* (2006.01)
*H01L 27/12* (2006.01)

(52) U.S. Cl.
CPC ........... *G02B 5/3058* (2013.01); *H01L 27/124* (2013.01); *H01L 27/1218* (2013.01)

(58) Field of Classification Search
CPC .. G02F 1/1335; G02B 5/3058; H01L 27/124
USPC ........................................................ 349/96
See application file for complete search history.

(56) References Cited

U.S. PATENT DOCUMENTS

| | | | |
|---|---|---|---|
| 2005/0253514 A1* | 11/2005 | Chun ................ | H01J 11/12 313/582 |
| 2005/0264205 A1* | 12/2005 | Chun ................ | H01J 11/12 313/584 |
| 2007/0177086 A1* | 8/2007 | Ishitani ............. | G02F 1/133528 349/117 |
| 2009/0290105 A1* | 11/2009 | Takada .............. | G02F 1/133528 349/96 |
| 2012/0080664 A1* | 4/2012 | Kim .................. | H01L 51/5253 257/40 |
| 2012/0105418 A1* | 5/2012 | Itoh .................. | G02F 1/133707 345/211 |
| 2013/0016293 A1* | 1/2013 | Cho .................. | G02B 5/201 349/15 |
| 2013/0021329 A1* | 1/2013 | Sakamoto ......... | G02B 27/2214 345/419 |
| 2013/0032827 A1* | 2/2013 | Moon ............... | G02F 1/136286 257/88 |

(Continued)

FOREIGN PATENT DOCUMENTS

KR 10-2007-0105092 10/2007
KR 10-2008-0024316 3/2008

(Continued)

*Primary Examiner* — Nathan W Ha
(74) *Attorney, Agent, or Firm* — H.C. Park & Associates, PLC

(57) ABSTRACT

A polarizing plate includes a substrate and a conductive pattern layer including a first pattern and a second pattern. The first pattern includes line-shaped structures disposed at intervals with a period shorter than a wavelength of incident light to be isolated from one another, the first pattern configured to transmit first polarized light of the incident light therethrough and reflect second polarized light of the incident light that is perpendicular to the first polarized light. The second pattern is disposed on an outer boundary of the first pattern, the second pattern isolated and insulated from the first pattern, the second pattern including a stem and at least one branch protruding from the stem toward the first pattern.

20 Claims, 15 Drawing Sheets

(56) References Cited

U.S. PATENT DOCUMENTS

2013/0033659 A1* 2/2013 Chung .............. G02F 1/133528
 349/61
2013/0033662 A1* 2/2013 Chung .............. G02F 1/133528
 349/96
2013/0038811 A1* 2/2013 Sugita .................... G02B 27/22
 349/61

FOREIGN PATENT DOCUMENTS

| | | |
|---|---|---|
| KR | 10-2009-0001371 | 1/2009 |
| KR | 10-2010-0080336 | 7/2010 |
| KR | 10-2011-0101893 | 9/2011 |
| KR | 10-2014-0013654 | 2/2014 |
| KR | 10-2014-0030382 | 3/2014 |
| KR | 10-2014-0074427 | 6/2014 |
| KR | 10-2014-0137734 | 12/2014 |

* cited by examiner

POLARIZING PLATE, TFT SUBSTRATE INCLUDING THE POLARIZING PLATE, AND METHOD OF MANUFACTURING THE POLARIZING PLATE

CROSS-REFERENCE TO RELATED APPLICATION

This application claims priority from and the benefit of Korean Patent Application No. 10-2014-0177458, filed on Dec. 10, 2014, which is hereby incorporated by reference for all purposes as if fully set forth herein.

BACKGROUND

1. Field

Exemplary embodiments of the present invention relate to a polarizing plate, a thin-film transistor (TFT) substrate including the polarizing plate, and a method of manufacturing the polarizing plate.

2. Discussion of the Background

A parallel conduction wire array that includes conductor wires arranged in parallel to each another to polarize light from electromagnetic waves may be referred to as a wire grid polarizer.

When non-polarized light is incident to a wire grid polarizer having a period smaller than the wavelength of the incident light, the wire grid polarizer may reflect polarized light that is parallel to a direction of the wires thereof, and transmit polarized light that is perpendicular to the direction of the wires thereof. A wire grid polarizer may be more beneficial than an absorptive polarizer in that the wire grid polarizer reuses reflected polarized light.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a polarizing plate with improved processability and transmissivity.

Additional aspects will be set forth in the detailed description which follows, and, in part, will be apparent from the disclosure, or may be learned by practice of the inventive concept.

Exemplary embodiments of the present invention also provide a method of manufacturing the polarizing plate with improved processability and transmissivity.

Exemplary embodiments of the present invention also provide a thin-film transistor (TFT) substrate with improved processability and transmissivity.

According to an exemplary embodiment of the present invention, a polarizing plate includes a substrate and a conductive pattern layer including a first pattern including line-shaped structures disposed at intervals of with a period shorter than a wavelength of incident light to be isolated from one another, the first pattern configured to transmit first polarized light of the incident light therethrough and reflect second polarized light of the incident light that is perpendicular to the first polarized light, and a second pattern disposed on an outer boundary of the first pattern, the second pattern to be isolated and insulated from the first pattern, the second pattern including a stem and at least one branch protruding from the stem toward the first pattern.

The conductive pattern layer may further include a third pattern configured to reflect the first polarized light and the second polarized light, the third pattern may be isolated and insulated from the second pattern.

The conductive pattern layer may be a metal pattern layer.

The metal pattern layer may include at least one of aluminum (Al), chromium (Cr), silver (Ag), copper (Cu), nickel (Ni), titanium (Ti), cobalt (Co), molybdenum (Mo), and an alloy thereof.

According to an exemplary embodiment of the present invention, a thin-film transistor (TFT) substrate includes a polarizing plate including a polarizer configured to transmit first polarized light of incident light therethrough and reflect second polarized light of the incident light that is perpendicular to the first polarized light, and gate wiring disposed on outer boundaries of the polarizer, and data wiring disposed on the polarizing plate.

The polarizer may include a first pattern including line-shaped structures disposed at intervals having a period shorter than a wavelength of the incident light.

The polarizer may be disposed in a pixel region surrounded by the gate wiring and the data wiring.

The gate wiring may include at least one gate line and at least one gate electrode protruding from the gate lines toward the first pattern.

The polarizing plate may further include a common electrode disposed on the outer boundary of the gate wiring.

The polarizing plate may further include a common electrode disposed on the outer boundary of the gate wiring, and the common electrode may include a common electrode line extending along a direction substantially parallel to the gate line, and a protrusion protruding from the common electrode line toward the first pattern.

The polarizing plate may further include at least one reflective portion configured to reflect the first polarized light and the second polarized light.

The reflective portion may be disposed between the gate lines and insulated from the gate lines.

The reflective portion may be disposed in a non-pixel region surrounding a pixel region.

According to an exemplary embodiment of the present invention, a method of manufacturing a polarizing plate includes forming a conductive layer on a substrate, forming a guide pattern layer on the conductive layer, the guide pattern layer including a first guide pattern including first barriers and a half-tone region connected to the first barriers, the half-tone region covering the conductive layer, and a second guide pattern including second barriers exposing the conductive layer between the second barriers, forming a second pattern by patterning the conductive layer using the second guide pattern, forming a third guide pattern by removing the half-tone region, forming a nano-structure of a self-aligned block copolymer in trenches formed is in the second pattern and the third guide pattern, and forming a first pattern by patterning the conductive layer using first domains or second domains disposed on the self-aligned block copolymer, in which the first pattern is configured to transmit first polarized light of the incident light therethrough and reflect second polarized light of the incident light that is perpendicular to the first polarized light, the second pattern is disposed on outer boundaries of the first pattern and isolated and insulated from the first pattern, and the second pattern includes a stem and at least one branch protruding from the stem toward the first pattern.

The method may further include trimming widths of the first barriers and the second barriers.

Trimming the widths of the first barriers and the second barriers may include an oxygen ($O_2$) plasma etching process.

Disposing the nano-structure of the self-aligned block copolymer may include disposing a block copolymer layer including first repeating units and second repeating units alternately disposed in the trenches, and annealing the block copolymer layer, in which the first repeating units and second repeating units have different etching rate from each other.

The block copolymer layer may include at least one of polystyrene-b-polybutadiene (PS-b-PB), polystyrene-b-polyisoprene (PS-b-PI), polystyrene-b-poly(methyl methacrylate) (PS-b-PMMA), polystyrene-b-poly(2-vinylpyridine) (PS-b-P2VP), polystyrene-b-poly(ferrocenyldimethylsilane) (PS-b-PFDMS), polystyrene-b-poly(tert-butylacrylate) (PS-b-PtBA), polystyrene-b-poly(ferrocenylethylmethylsilane) (PS-b-PFEMS), polyisoprene-b-poly(ethyleneoxide) (PI-b-PEO), polybutadiene-b-poly(butadiene-b-vinylpyridinium) (PB-b-PVP), poly(tert-butylacrylate)-b-poly(cinnamoyl-ethylmethacrylate) (PtBA-b-PCEMA), polystyrene-b-polyactide (PS-b-PLA), poly(α-methylstyrene)-b-poly(4-hydroxystyrene) (PαMS-b-PHS), pentadecyl phenol modified polystyrene-b-poly(4-vinylpyridine) (PPDPS-b-P4VP), poly(styrene-b-ethyleneoxide) (PS-b-PEO), polystyrene-b-poly(dimethyl siloxane) (PS-b-PDMS), polystyrene-b-polyethylene) (PS-b-PE), polystyrene-b-poly(ferrocenyl dimethyl silane) (PS-b-PFS), polystyrene-b-poly(paraphenylene) (PS-b-PPP), PS-b-PB-b-PS, PS-b-PI-b-PS, poly(propyleneoxide))-b-PEO (PEO-b-PPO), poly(4-vinyl-phenyldimethyl-2-propoxysilane))-b-PI-b-PVPDMPS (PVPDMPS), PS-b-P2VP-b-PtBMA, and a block copolymer (BCP) thereof.

Annealing the block copolymer layer may include thermal annealing or solvent annealing.

Disposing the first pattern may include removing one of the first domains and the second domains, the first domains being obtained by self-aligning the first repeating units of the block copolymer layer, and the second domains being obtained by self-aligning the second repeating units of the block copolymer layer, and patterning the conductive layer using one of the remaining first domains and the second domains.

According to the exemplary embodiments of the present invention, it may be possible to provide a polarizing plate with improved processability and transmissivity, a TFT substrate including the polarizing plate, and a method of manufacturing the polarizing plate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
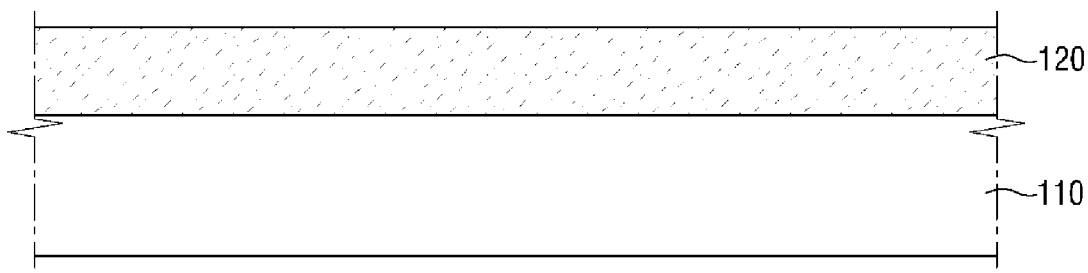
FIGS. 1 to 8 are cross-sectional views illustrating a method of manufacturing a polarizing plate, according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1 to 8 are cross-sectional views illustrating a method of manufacturing a polarizing plate, according to an exemplary embodiment of the present invention.

Referring to FIG. 1, a conductive layer 120 may be formed on a substrate 110. The conductive layer 120 may cover the entire surface of the substrate 110.

The material of the substrate 110 may be selected in consideration of the purpose of use of the substrate 110 and the type of processing applied to the substrate 110, as long as the substrate 110 may transmit visible light. According to an exemplary embodiment of the present invention, the substrate 110 may be formed of various polymer compounds, such as glass, quartz, acrylic, triacetyl cellulose (TAC), a cyclic olefin copolymer (COC), a cyclic olefin polymer (COP), polycarbonate (PC), polyethylene naphthalate (PET), polyimide (PI), polyethylene naphthalate (PEN), polyethersulfone (PES), and polyarylate (PAR). Alternatively, the substrate 110 may be formed of an optical film material with a certain degree of flexibility.

The conductive layer 120 may be formed of any conductive material. According to an exemplary embodiment of the present invention, the conductive layer 120 may be formed of a metal material, such as aluminum (Al), chromium (Cr), silver (Ag), copper (Cu), nickel (Ni), titanium (Ti), cobalt (Co), molybdenum (Mo), and an alloy thereof.

The conductive layer 120 may include at least two layers, for example, a first conductive layer (not illustrated) formed of Al and a second conductive layer (not illustrated) formed of Ti or Mo. When the first conductive layer is formed of Al alone, hillocks may be generated from applied temperatures during subsequent manufacturing processes. As a result, a top surface of the first conductive layer may become irregular, which may deteriorate optical properties of the first conductive layer. The second conductive layer may be formed on the first conductive layer using Ti or Mo, to prevent generating hillocks on the first conductive layer.

The conductive layer 120 may be formed by a typical sputtering method, such as a chemical vapor deposition (CVD) method or an evaporation method.

Figure 2:
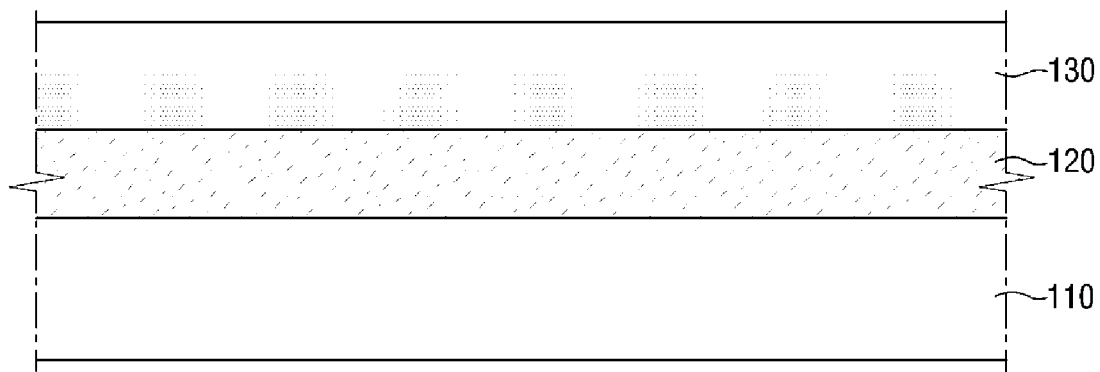

Referring to FIG. 2, a guide layer 130 may be formed on the conductive layer 120.

The guide layer 130 may be formed of photoresist. The guide layer 130 may cover entire surface of the conductive layer 120. The guide layer 130 may be patterned into a guide pattern layer including line-shaped structures.

Figure 3:
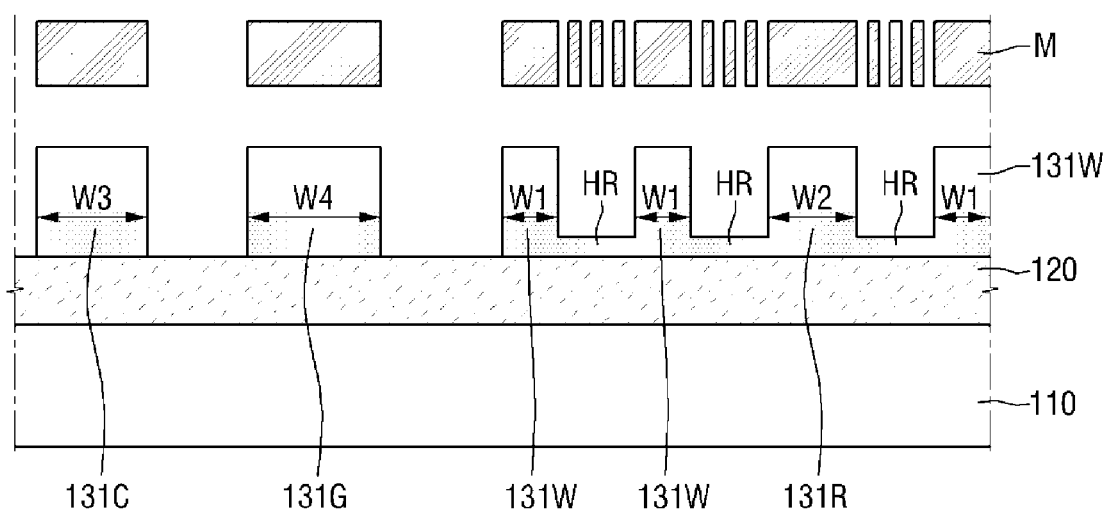

Referring to FIG. 3, the guide pattern layer may be formed by etching or patterning the guide layer 130 illustrated in FIG. 2. The guide pattern layer may include a first guide pattern including barriers 1 (131W and 131R) and a second guide pattern including barriers 2 (131C and 131G).

For convenience of illustration, barriers 1 (131W and 131R) may be classified into barriers 1-1 (131W) and barrier 1-2 (131R), and barriers 2 (131C and 131G) may be classified into barrier 2-1 (131C) and barrier 2-2 (131G).

Barriers 1-1 (131W) and barrier 1-2 (131R) may be arranged to be isolated from each other, and barrier 2-1 (131C) and barrier 2-2 (131G) may be arranged to be isolated from each other. The first guide pattern may include a half-tone region HR that connects barriers 1 (131W and 131R). Since the half-tone region HR may cover the conductive layer 120, the first guide pattern may not expose the conductive layer 120 between barriers 1 (131W and 131R). On the other hand, the second guide pattern may expose the conductive layer 120 between isolated barriers 2 (131C and 131G).

A width W1 of barriers 1-1 (131W) may be smaller than a width W2 of barrier 1-2 (131R). A width W3 of barrier 2-1 (131C) may be smaller than a width W4 of barrier 2-2 (131G). Barriers 1-1 (131W) may serve as a guide pattern for forming a first pattern, and barrier 1-2 (131R) may serve as a guide pattern for forming at least one reflective portion or a third pattern. Barrier 2-1 (131C) and barrier 2-2 (131G) may serve as a guide pattern for forming a second pattern. More specifically, barrier 2-1 (131C) may serve as a guide pattern for forming a common electrode line, and barrier 2-2 (131G) may serve as a guide pattern for forming a gate line. According to an exemplary embodiment of the present invention, barrier 2-1 (131C) may be omitted.

Barriers 1 (131W and 131R) and barriers 2 (131C and 131G) may be formed by exposing and developing the guide layer 130 (illustrated in FIG. 2) formed of photoresist by using a mask. Various patterning methods may be used to form barriers 1 (131W and 131R) and barriers 2 (131C and 131G).

The first guide pattern and the second guide pattern may be formed using a mask M. The first guide pattern may be formed by using a half-tone mask. When the first guide pattern is formed using the half-tone mask, the second guide pattern may be formed using a single mask.

When the half-tone mask is not used, at least two masks and nine steps may be required to selectively pattern a second region of the conductive layer 120 overlapping the second guide pattern. However, when the half-tone mask is used to form the first guide pattern, the second region of the conductive layer 120 that overlaps the second guide pattern may be selectively patterned using a single mask in only six steps. Accordingly, the efficiency of the manufacture of a polarizing plate may be improved.

Figure 4:
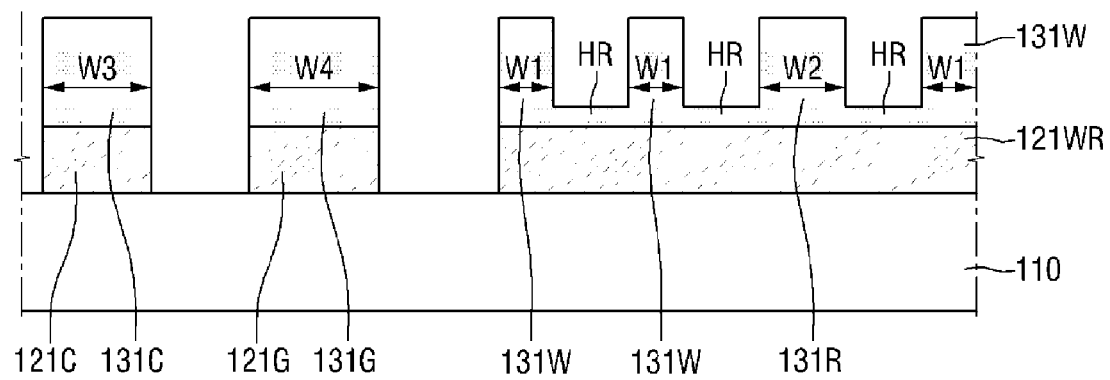

Referring to FIGS. 3 and 4, the conductive layer 120 may be patterned into conductive pattern layers 121C and 121G using the second guide pattern. Portions of the conductive layer 120 covered by the barriers 2 (131C and 131G) may remain on the substrate 110 after an etching process, while remaining portions of the conductive layer 120 not covered by the barriers 2 (131C and 131G) may be removed from the etching process. The conductive pattern layers 121C and 121G, which correspond to portions of the conductive layer 120 covered by the barriers 2 (131C and 131G), may be a common electrode line and a gate line in subsequent processes. A conductive pattern layer 121WR may not be patterned as being covered by the first guide pattern. According to an exemplary embodiment of the present invention, barrier 2-1 (131C) and the conductive pattern layer 121C may be omitted.

Figure 5:
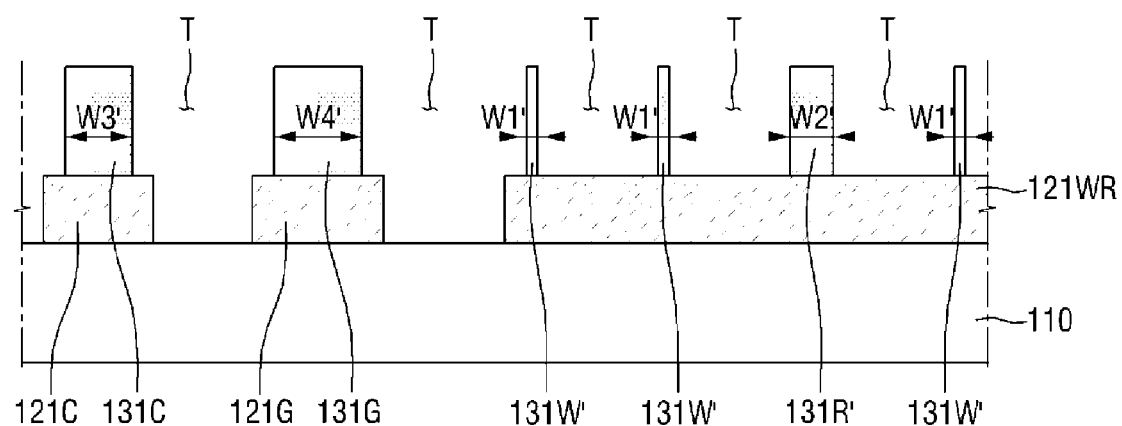

Referring to FIGS. 4 and 5, the half-tone region HR of the first guide pattern may be removed. After the removal of the half-tone region HR of the first guide pattern, the conductive pattern layer 121WR may be partially exposed between barriers 2 (131C and 131G).

Referring to FIG. 5, a trimming process may be performed to reduce the widths of barriers 1 (131W and 131R) and barriers 2 (131C and 131G) into widths W1, W2, W3, and W4. Barriers 1-1 (131W) may be transformed into barriers 1-1' (131W') by the trimming process. A width W1' of barriers 1-1' (131W') may be smaller than the width W1 of barriers 1-1 (131W). Barrier 1-2 (131R) may be transformed into barrier 1-2' (131R'). A width W2' of barrier 1-2' (131R') may be smaller than the width W2 of barrier 1-2 (131R). Barrier 2-1 (131C) may be transformed into barrier 2-1' (131C'). A width W3' of barrier 2-1' (131C') may be smaller than the width W3 of barrier 2-1 (131C). Barrier 2-2 (131G) may be transformed into barrier 2-2' (131G'). A width W4' of barrier 2-2' (131G') may be smaller than the width W4 of barrier 2-2 (131G). The width W3' of barrier 2-1' (131C') and the width W4' of barrier 2-2' (131G') may be smaller than the width of the conductive pattern layer 121C and the width of the conductive pattern layer 121G respectively. Barrier 2-1' (131C') and the conductive pattern layer 121C may be omitted.

As the widths of the barriers (131W', 131R', 131C', and 131G'), i.e., the widths W1', W2', W3', and W4', decrease, the aperture ratio or transmissivity of a polarizing plate may increase. More specifically, the smaller the widths W1', W2', W3', and W4', the greater the number of domains may be formed in trenches T between the barriers (131W', 131R', 131C', and 131G'), and the greater the aperture ratio of a polarizing plate.

The trimming process may be performed using plasma etching. Any plasma that may reduce the widths of the barriers (131W, 131R, 131C and 131G), i.e., the widths W1, W2, W3, and W4, may be used. According to an exemplary embodiment of the present invention, the trimming process may use oxygen ($O_2$) plasma.

Figure 6:
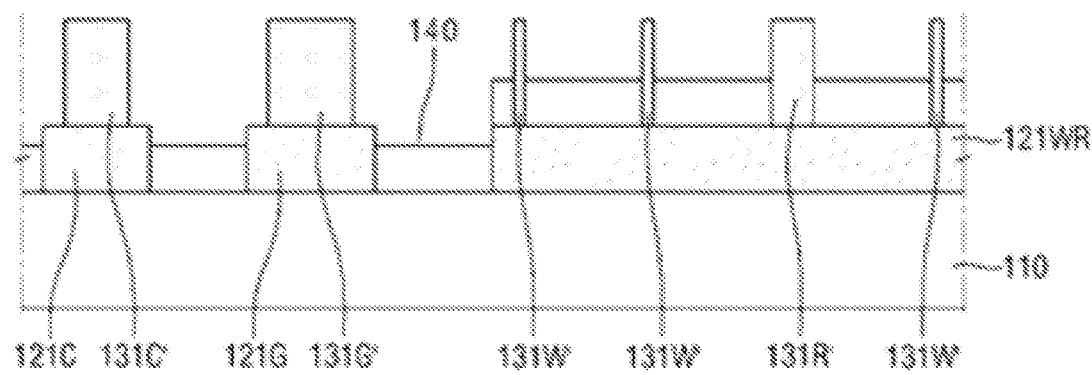

Referring to FIG. 6, the trenches T may be formed between the barriers (131W', 131R', 131C', and 131G'), and a block copolymer layer 140 may be formed in each of the trenches T.

The block copolymer layer 140 may include first repeating units and second repeating units. The block copolymer layer 140 may be formed of polystyrene-b-polybutadiene (PS-b-PB), polystyrene-b-polyisoprene (PS-b-PI), polystyrene-b-poly(methyl methacrylate) (PS-b-PMMA), polystyrene-b-poly(2-vinylpyridine) (PS-b-P2VP), polystyrene-b-poly(ferrocenyl-dimethylsilane) (PS-b-PFDMS), polystyrene-b-poly(tert-butylacrylate) (PS-b-PtBA), polystyrene-b-poly(ferrocenylethylmethylsilane) (PS-b-PFEMS), polyisoprene-b-poly(ethyleneoxide) (PI-b-PEO), polybutadiene-b-poly(butadiene-b-vinylpyridinium) (PB-b-PVP), poly(tert-butylacrylate)-b-poly(cinnamoyl-ethylmethacrylate) (PtBA-b-PCEMA), polystyrene-b-polyactide (PS-b-PLA), poly(α-methylstyrene)-b-poly(4-hydroxystyrene) (PαMS-b-PHS), pentadecyl phenol modified polystyrene-b-poly(4-vinylpyridine) (PPDPS-b-P4VP), poly(styrene-b-ethyleneoxide) (PS-b-PEO), polystyrene-b-poly(dimethyl siloxane) (PS-b-PDMS), polystyrene-b-polyethylene) (PS-b-PE), polystyrene-b-poly(ferrocenyl dimethyl silane) (PS-b-PFS), polystyrene-b-poly(paraphenylene) (PS-b-PPP), PS-b-PB-b-PS, PS-b-PI-b-PS, poly (propyleneoxide))-b-PEO (PEO-b-PPO), poly(4-vinyl-phenyldimethyl-2-propoxysilane))-b-PI-b-PVPDMPS (PVPDMPS), PS-b-P2VP-b-PtBMA, or a block copolymer (BCP) thereof.

The first repeating units and the second repeating units may have different chemical properties. The first repeating units and the second repeating units may be micro-phase-separated through self-assembly. The first repeating units and the second repeating units may have different etching rates. First domains 141 where the first repeating units are self-aligned or second domains 142 where the second repeating units are self-aligned may be selectively removed. Either the first repeating units or the second repeating units may have selective responsiveness to the barriers (131W', 131R', 131C', and 131G').

Figure 7:
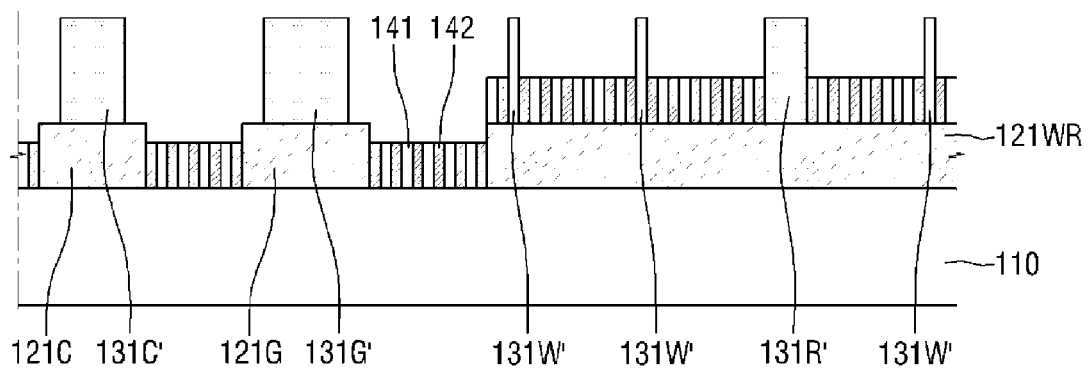

Referring to FIGS. 5 and 7, the block copolymer layer 140 may be self-assembled, thereby forming a self-aligned block copolymer layer where first domains 141 and second domains 142 are alternately arranged. The self-assembling of the block copolymer layer 140 may be performed by, for example, an annealing process. The annealing process may include thermal annealing and solvent annealing.

Thermal annealing may include a micro-phase separation of a block copolymer by heating the block copolymer to a temperature higher than the glass transition temperature thereof, and solvent annealing may include a micro-phase separation by exposing a thin-film polymer containing a block copolymer to a solvent vapor so as to impart mobility to polymer chains.

When solvent annealing is used, the height of the barriers (131W, 131R, 131C, and 131G) after the trimming process may be at least 2.5 times greater than the height of the block copolymer layer 140. More specifically, during solvent annealing, a vaporized solvent may infiltrate into the block copolymer layer 140, thereby swelling the block copolymer layer 140. Accordingly, in order to prevent the block copolymer layer 140 from spilling out of the trenches T, the height of the barriers (131W, 131R, 131C, and 131G) may be at least 2.5 times greater than the height of the block copolymer layer 140. The self-assembled block copolymer layer 140 may include the first domains 141 and the second domains 142. The first domains 141 may include first repeating units and the second domains 142 may include second repeating units. The first domains 141 may be formed by self-aligning first repeating units, and the second domains 142 may be formed by self-aligning second repeating units.

Figure 8:
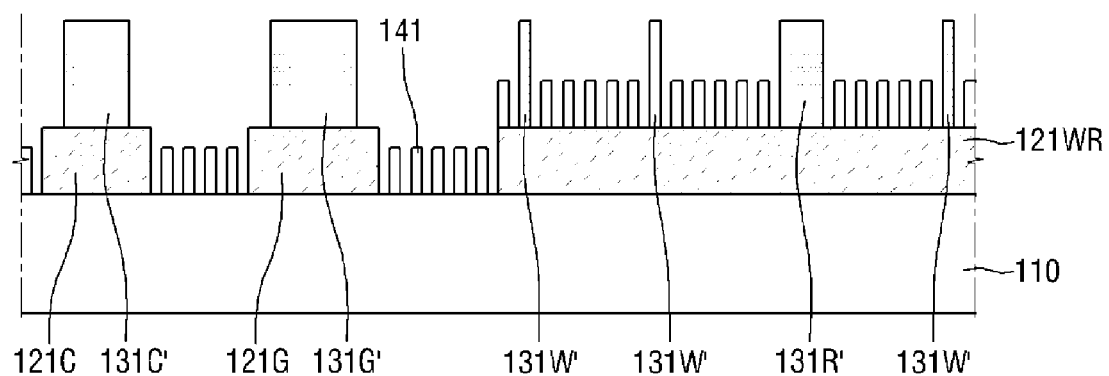

Referring to FIG. 8, the second domains 142 may be selectively removed. According to an exemplary embodiment of the present invention, to selectively remove the second domains 142, a solvent with a high affinity to the second domains 142 may be used to remove the second domains 142. Alternatively, the second domains 142 may be selectively removed by a dry etching process. At least one gas of $O_2$, a fluorocarbon gas, or hydrogen fluoride (HF) may be used in the dry etching process FIG. 9 is a cross-sectional view of a polarizing plate according to an exemplary embodiment of the present invention.

Figure 9:
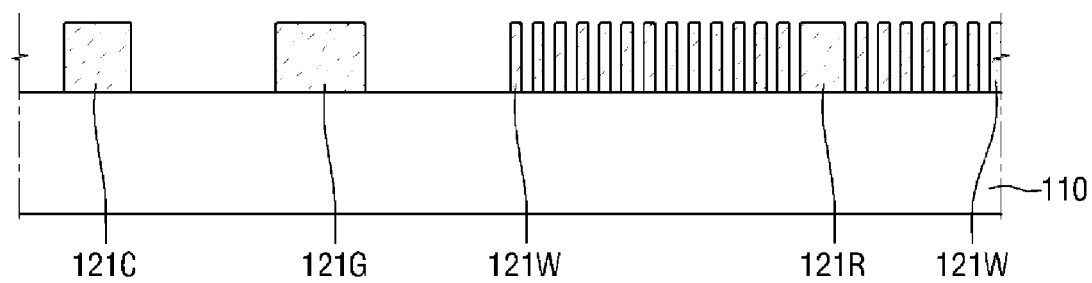
FIG. 9 is a cross-sectional view of a polarizing plate according to an exemplary embodiment of the present invention.

Referring to FIGS. 8 and 9, a first pattern and a third pattern may be formed by patterning the conductive pattern layer 121WR, using the first guide pattern and the second domains 142 as a mask. More specifically, portions of the conductive pattern layer 121WR covered by barriers 1-1' (131W') and the second domains 142 (i.e., a conductive pattern layer 121W and a conductive pattern layer 121R) may remain on the substrate 110 to form the first pattern.

The first pattern may include conductive pattern layers 121W having line-shaped structures arranged at intervals with a period shorter than the wavelength of incident light. The first pattern may transmit first polarized light of the incident light therethrough, and reflect second polarized light of the incident light that is perpendicular to the first polarized light. The first pattern may be disposed in a pixel region surrounded by gate wiring and data wiring.

The conductive pattern layer 121R, which corresponds to a portion of the conductive pattern layer 121WR covered by the barrier 1-2' (131R'), may remain on the substrate 110 to form the third pattern. The third pattern may serve as a reflective portion, and recycle the second polarized light reflected by the first pattern. The third pattern including the conductive pattern layer 121R may reflect the first polarized light and the second polarized light. The third pattern may be disposed in the pixel region surrounded by gate lines and data lines.

Conductive pattern layers 121C and 121G, which correspond to parts to be formed as wiring, may form a second pattern and serve as a common electrode line and a gate line, respectively. The conductive pattern layer 121C may be omitted. The second pattern may be disposed in a non-pixel region surrounding the pixel region. In the non-pixel region, a light-blocking layer, for example, a black matrix may be provided.

Referring to FIG. 9, the polarizing plate according to an exemplary embodiment of the present invention may include the substrate 110 and the conductive pattern layers (121C, 121G, 121W and 121R) disposed on the substrate 110. The polarizing plate may be obtained by removing the barriers (131W', 131R', 131C' and 131G') formed on the conductive pattern layers (121C, 121G, 121W and 121R), the second domains 142 formed on the substrate 110, and the conductive pattern layers (121C, 121G, 121W and 121R).

Figure 10:
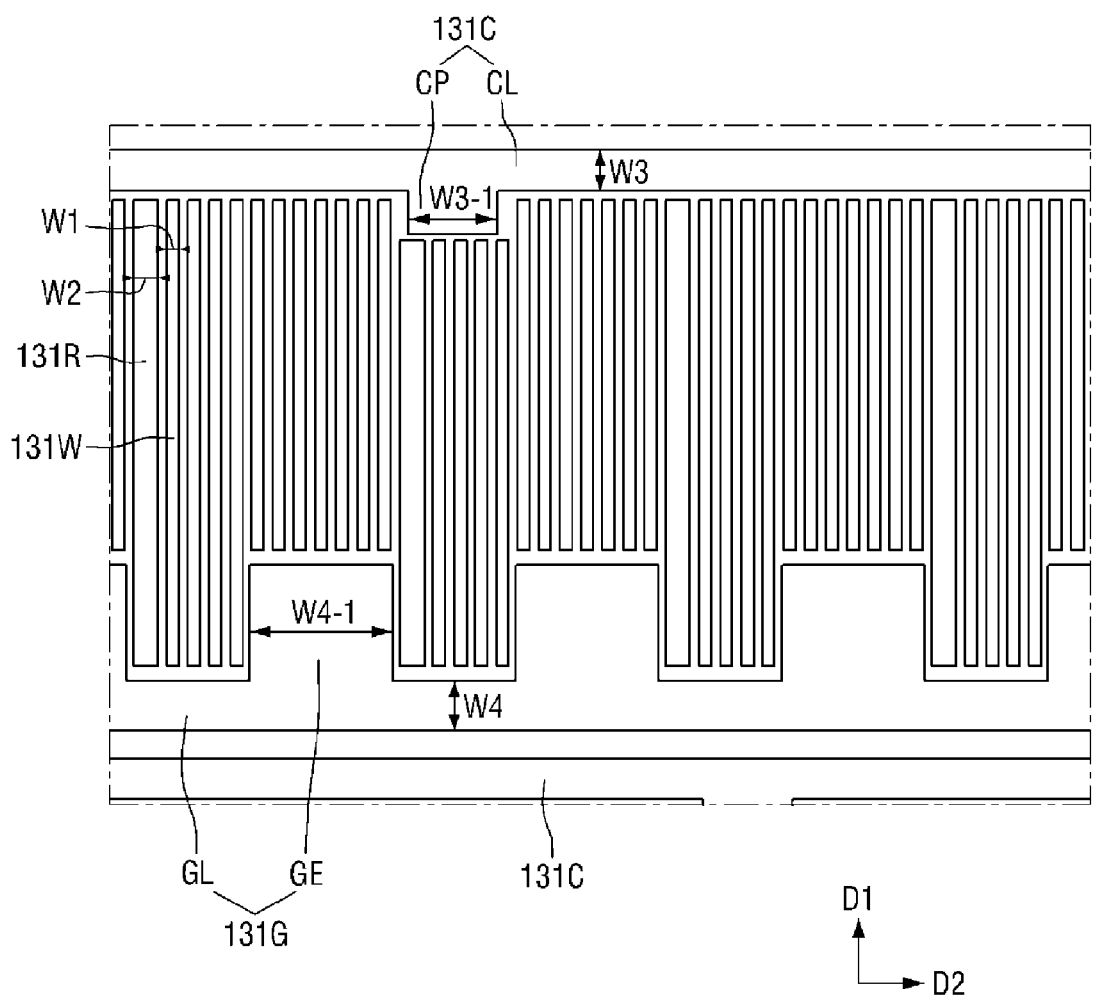
FIG. 10 is a plan view of a polarizing plate illustrating an exemplary embodiment of the present invention according to the process of FIG. 4.

FIG. 10 is a plan view of a polarizing plate illustrating an exemplary embodiment of the present invention according to the process of FIG. 4.

Referring to FIG. 10, barriers 1-1 (131W) and barriers 1-2 (131R) may be periodically arranged in a first direction D1. Barrier 2-1 (131C) may include a stem CL extending in a second direction D2, and a branch CP protruding from the stem CL in the first direction D1. Barrier 2-2 (131G) may include a stem GL extending in the second direction D2, and a branch GE protruding from the stem GL in the first direction D1. Barriers 1 (131W and 131R) and barriers 2 (131C and 131G) may be isolated and insulated from each other. The branches CP and GE may protrude toward barriers 1-1 (131W) and barriers 1-2 (131R), respectively.

A width W1 of barriers 1-1 (131W) may be smaller than a width W2 of barriers 1-2 (131R). A width W3 of the stem CL of barrier 2-1 (131C) may be smaller than a width W4 of the stem GL of barrier 2-2 (131G), and a width W3-1 of the branch CP of barrier 2-1 (131C) may be smaller than a width W4-1 of the branch GP of barrier 2-2 (131G).

Figure 11:
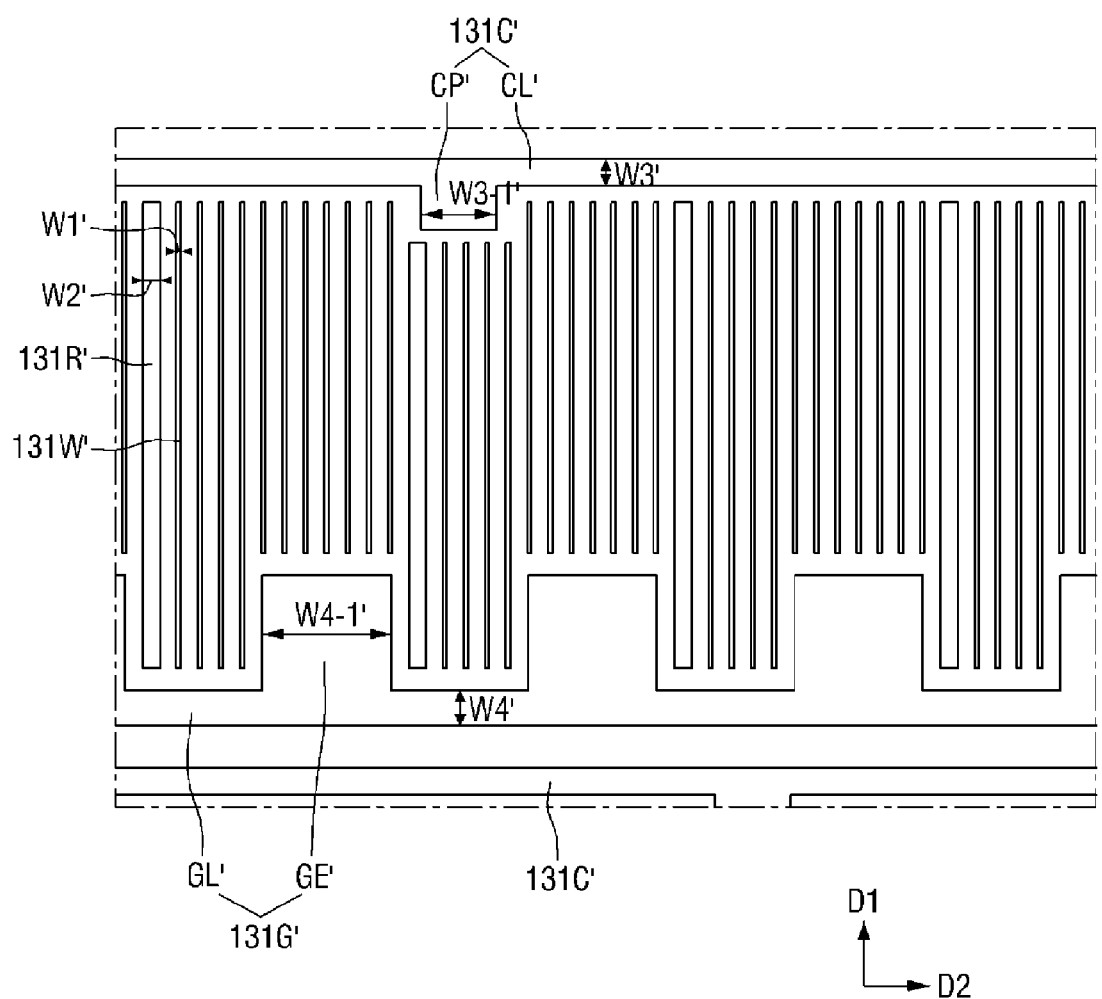
FIG. 11 is a plan view of a polarizing plate illustrating an exemplary embodiment of the present invention according to the process of FIG. 5.

FIG. 11 is a plan view of a polarized plate illustrating an exemplary embodiment of the present invention according to the process of FIG. 5

Referring to FIGS. 10 and 11, the widths of barriers 1' (131W' and 131R'), i.e., widths W1' and W2', may be smaller than the widths of barriers 1 (131W and 131R), i.e., the widths W1 and W2. The widths of barriers 2' (131C' and 131G'), i.e., widths W3' and W4', may be smaller than the widths of barriers 2 (131C and 131G), i.e., the widths W3 and W4.

More specifically, barriers 1-1 (131W) may be transformed into barriers 1-1' (131W'). The width W1' of barriers 1-1' (131W') may be smaller than the width W1 of barriers 1-1 (131W). Barriers 1-2 (131R) may be transformed into barriers 1-2' (131R'). The width W2' of barriers 1-2' (131R') may be smaller than the width W2 of barriers 1-2 (131R). Barrier 2-1 (131C) may be transformed into barrier 2-1' (131C'). The width W3' and a width W3-1' of barrier 2-1' (131C') may be smaller than the width W3 and a width W3-1, respectively, of barrier 2-1 (131C). Barrier 2-2 (131G) may be transformed into barrier 2-2' (131G'). The width W4' and a width W4-1' of barrier 2-2' (131G') may be smaller than the width W4 and a width W4-1, respectively, of barrier 2-2 (131G).

A first pattern may be formed using barriers 1-1' (131W'), a third pattern may be formed by barriers 1-2' (131R'), and a second pattern may be formed by barrier 2-1' (131C') and barrier 2-2' (131G').

A branch CP' of barrier 2-1' (131C') and branches GE' of barrier 2-2' (131G') may protrude toward barriers 1-1' (131W'). As illustrated in FIGS. 9 and 11, portions of the conductive pattern layers 121C and 121G covered by a stem CL' of barrier 2-1' (131C'), a stem GL' of barrier 2-2' (131G'), the branch CP' of barrier 2-1' (131C'), and the branches GE' of barrier 2-2' (131G') may remain unremoved from an etching process. The portions of the conductive pattern layers 121C and 121G covered by the branch CP' of barrier 2-1' (131C') and the branches GE' of barrier 2-2' (131G') may be formed to protrude toward the conductive pattern layer 121W. The portions of the conductive pattern layers 121C and 121G covered by the stem CL' of barrier 2-1' (131C') and the stem GL' of barrier 2-2' (131G') may be aligned in the second direction D2. The stem CL' of barrier 2-1' (131C') and the stem GL' of barrier 2-2' (131G') may form a common electrode line and a gate line, respectively. The branch CP' of barrier 2-1' (131C') may form a common electrode protrusion protruding toward the first pattern, and the branches GE' of barrier 2-2' (131G') may form gate electrodes protruding toward the first pattern.

Figure 12:
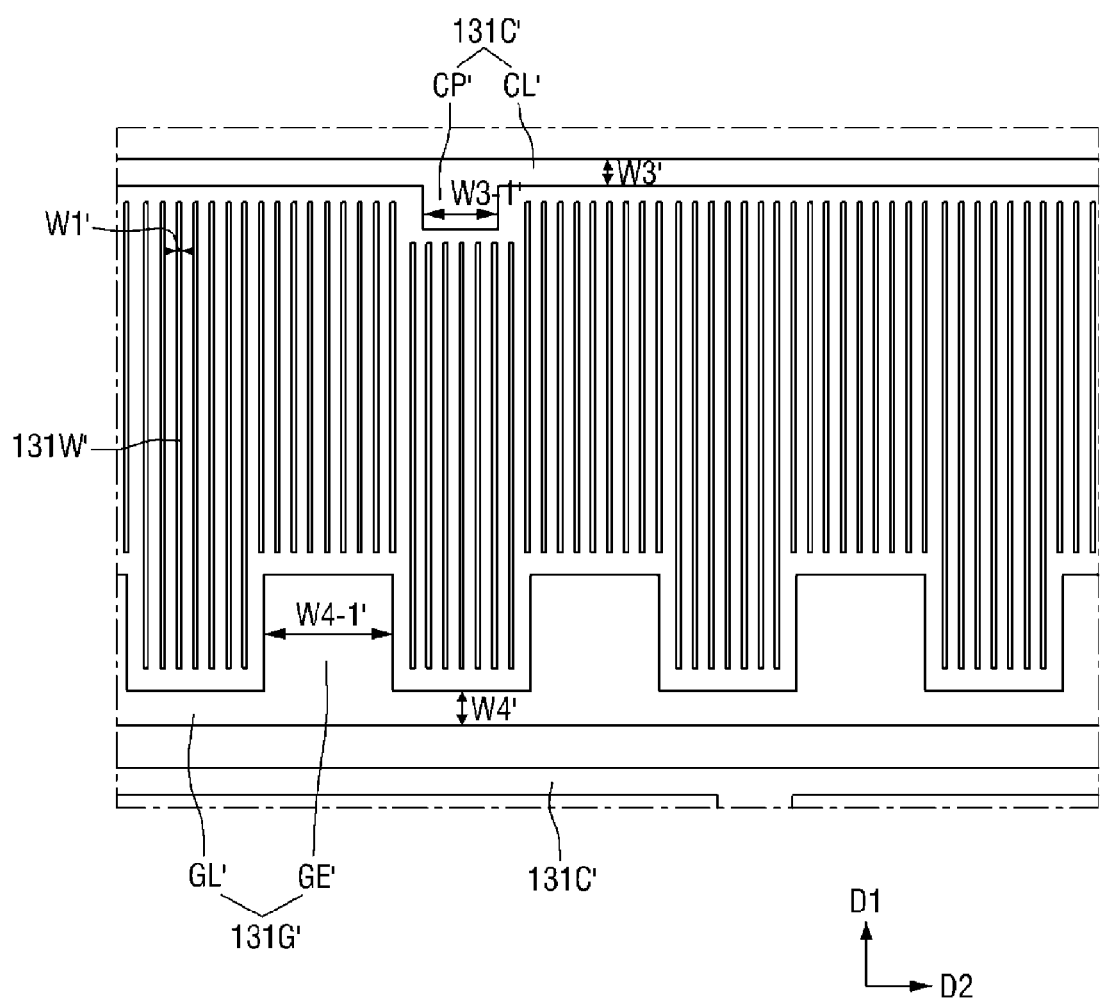
FIGS. 12 to 14 are plan views of a polarizing plate illustrating exemplary embodiments of the present invention according to the process of FIG. 5.
Figure 13:
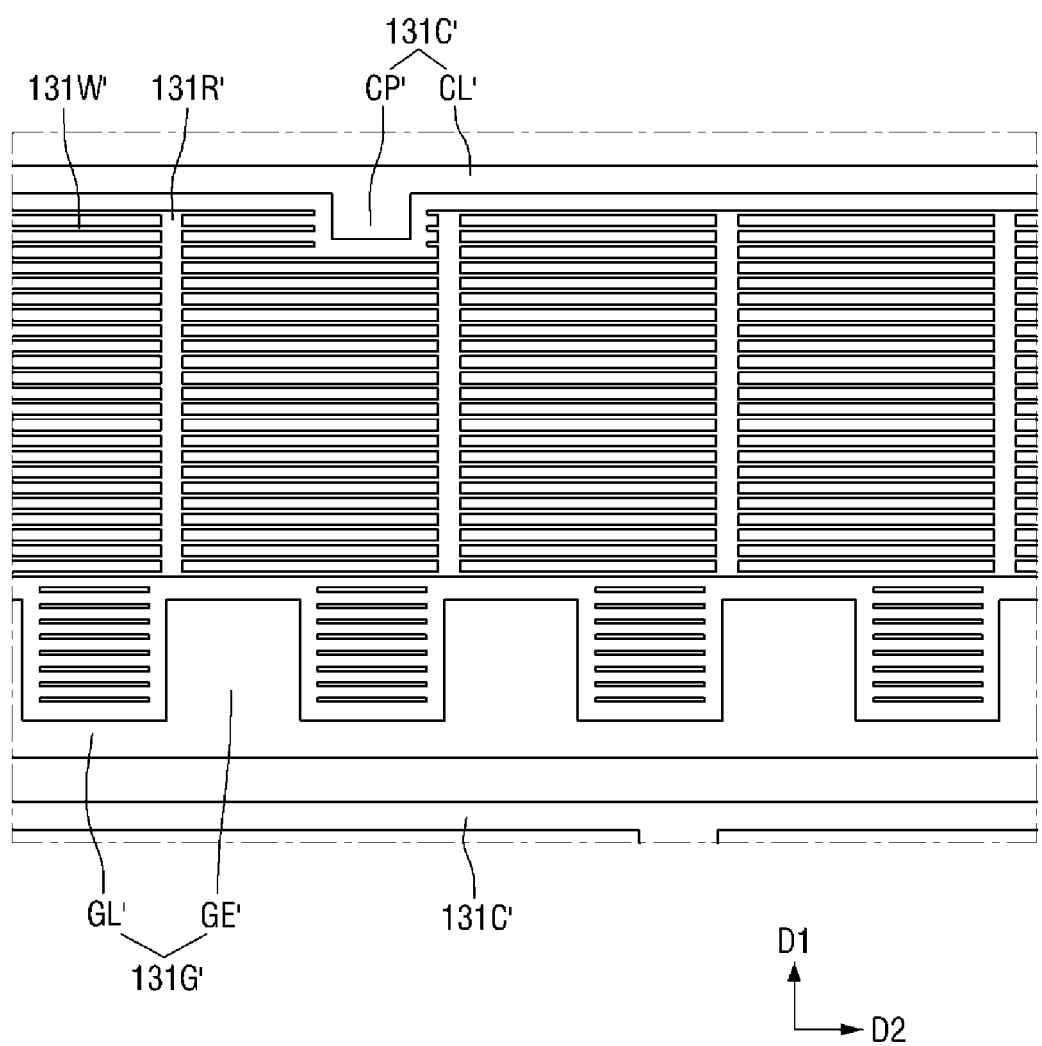
Figure 14:
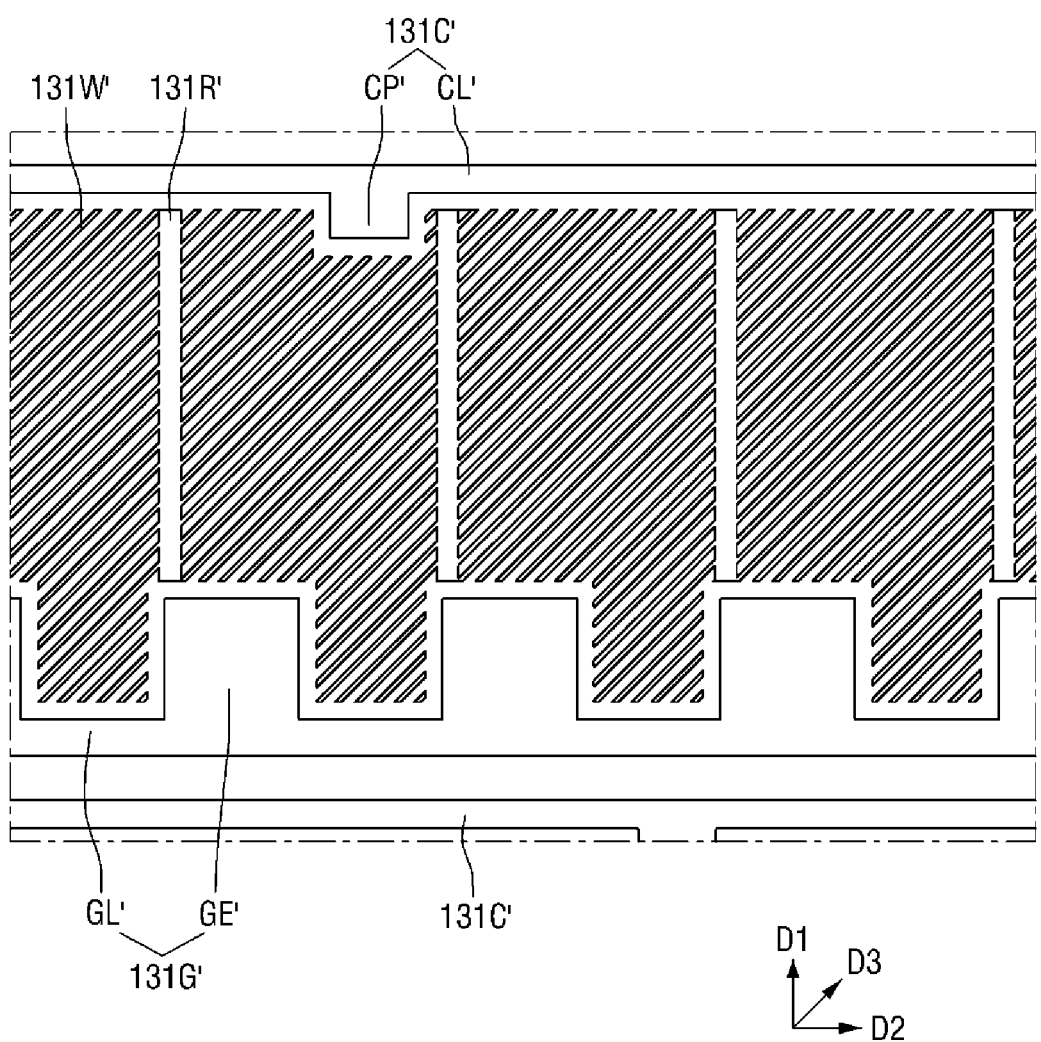

FIGS. 12 to 14 are plan views of a polarizing plate illustrating exemplary embodiments of the present invention according to the process of FIG. 5.

According to an exemplary embodiment of the present invention illustrated in FIG. 12, no barriers 1-2' (131R') are disposed among barriers 1-1' (131W'). Referring to FIGS. 9 and 12, no conductive pattern layer 121R is formed on the polarizing plate. More particularly, a third pattern and reflective portions are omitted in the polarizing plate.

According to an exemplary embodiment of the present invention illustrated in FIG. 13, barriers 1-1' (131W') may be arranged in the second direction D2, rather than in the first direction D1, and connected to barriers 1-2' (131R'). Referring to FIG. 13, barrier 2-1' (131C') and barrier 2-2' (131G') may be isolated from barriers 1-1' (131W') and barriers 1-2' (131R').

According to an exemplary embodiment of the present invention illustrated in FIG. 14, barriers 1-1' (131W') may be arranged in a third direction D3, rather than in the first direction D1, and connected to barriers 1-2' (131R'). Referring to FIG. 14, barrier 2-1' (131C') and barrier 2-2' (131G') may be isolated from barriers 1-1' (131W') and barriers 1-2' (131R').

Figure 15:
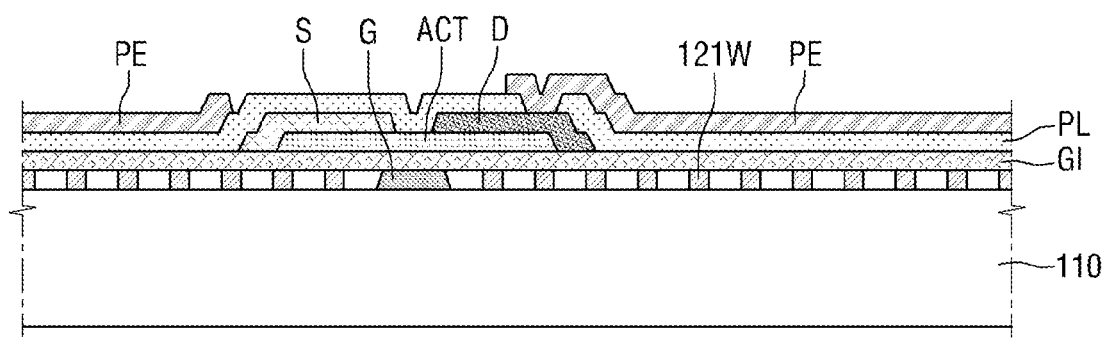
FIG. 15 is a cross-sectional view of a thin-film transistor (TFT) substrate according to an exemplary embodiment of the present invention.

FIG. 15 is a cross-sectional view of a thin-film transistor (TFT) substrate according to an exemplary embodiment of the present invention.

The structure of the TFT substrate according to the present exemplary embodiment will hereinafter be described with reference to FIG. 15. Referring to FIG. 15, a gate electrode G is disposed on a substrate 110, and a gate insulating layer GI is disposed on the gate electrode G. A semiconductor layer ACT is disposed on the gate insulating layer GI in a region at least partially overlapping the gate electrode G, and a source electrode S and a drain electrode D are disposed on the semiconductor layer ACT to be isolated from each other. A passivation layer PL is disposed on the gate insulating layer GI, the source electrode S, the semiconductor layer ACT, and the drain electrode D. A pixel electrode PE is disposed on the passivation layer PL and may be electrically connected to the drain electrode D via a contact hole that exposes at least part of the drain electrode D therethrough.

A conductive pattern layer 121W may be disposed on the substrate 110 to be disposed on the same surface with the gate electrode G. The conductive pattern layer 121W may form a first pattern. The first pattern may serve as a polarizer. A polarizing plate may include wiring, such as the gate electrode G, and a polarizer.

Conventionally, an insulating layer may be disposed between the gate electrode G and a wire grid polarizer, to isolate the gate electrode G and the wire grid polarizer from each other, which may increase complexity of TFT fabrication, increase manufacturing cost of a TFT substrate, and lower the aperture ratio or transmissivity of a TFT substrate. The TFT substrate according to an exemplary embodiment of the present invention may include wirings, such as the gate electrode G, and a polarizer, and thus may reduce the number of processes for fabricating a TFT substrate and the manufacturing cost of a TFT substrate, and improve the aperture ratio or transmissivity of a TFT substrate.

To realize a high-resolution display device, the size of pixels may need to be reduced. However, reducing the size of wiring by current exposure technology may be limited. A TFT substrate or a display device including the polarizing plate according to an exemplary embodiment of the present invention may be formed with the width of wiring reduced during the fabrication of a polarizer, and as a result, the aperture ratio or transmissivity of the TFT substrate or the display device may be improved.

The TFT substrate according to an exemplary embodiment of the present invention may also include a third pattern or one or more reflective portions, which are formed using barriers 1-2' (131R'). More specifically, the conductive pattern layer 121R of FIG. 9 may be disposed on the substrate 110 to be on the same surface with the first pattern. The conductive pattern layer 121 may form a third pattern, and the third pattern may improve the luminance of a display device by recycling second polarized light reflected from the first pattern.

The polarizing plate according to according to an exemplary embodiment of the present invention will hereinafter be referred to as a lower polarizing plate, and a display device including the lower polarizing plate will hereinafter be described.

The display device may additionally include a backlight unit (not illustrated) that emits light, a TFT substrate (not illustrated), an upper substrate (not illustrated) facing the TFT substrate, a liquid crystal layer (not illustrated) disposed between the TFT substrate and the upper substrate, and an upper polarizing plate (not illustrated) disposed on the upper substrate.

The transmission axes of the upper polarizing plate and the lower polarizing plate may be orthogonal or parallel to each other. The upper polarizing plate and the lower polarizing plate may be a wire grid polarizer or a typical polyvinyl alcohol (PVA) based polarizing film. The upper polarizing plate may be omitted.

The backlight unit may include a light guide plate (LGP) (not illustrated), one or more light source units (not illustrated), a reflective member (not illustrated), and one or more optical sheets (not illustrated).

The LGP may change a path of light emitted from the light source unit so that the light is transmitted toward the liquid crystal layer. The LGP may include a light incidence surface upon which light is incident, and a light emission surface through which light is emitted toward the liquid crystal layer. The LGP may be formed of a light-transmitting material with refractive index, such as polymethyl methacrylate (PMMA) or polycarbonate (PC).

Light incident upon one or both sides of the LGP may have a smaller incidence angle than the critical angle of the LGP, and may thus enter the LGP. On the other hand, when light incident upon the top or bottom surface of the LGP has a greater incidence angle than the critical angle of the LGP, and the light may be evenly distributed throughout the LGP, instead of being emitted outwards from the LGP.

A diffusion pattern (not illustrated) may be formed on one of the top and bottom surfaces of the LGP. For example, the bottom surface of the LGP opposite to the light emission surface of the LGP may guide light to be emitted upwards. More specifically, in order for light transmitted within the LGP to be emitted upwards, the diffusion pattern may be printed on one surface of the LGP with ink. That is, an array of fine grooves or protrusions may be formed on the LGP as the diffusion pattern, or various other modifications may be made to the diffusion pattern without departing from the scope of the invention.

A reflective member (not illustrated) may be additionally provided between the LGP and a lower receiving member (not illustrated). The reflective member may reflect light emitted from the bottom surface of the LGP, which is opposite to, and faces, the light emission surface of the LGP, and thus may apply the light back to the LGP. The reflective member may be formed as a film.

The light source units may be disposed to face the light incidence surface of the LGP. The number of light source units provided may vary. For example, a single light source unit may be provided on one side of the LGP. Alternatively, three or more light source units may be provided to correspond to three or more sides of the LGP. Alternatively, light source units may be provided to correspond to only one side of the LGP. The backlight unit may be a side light-type backlight unit in which one or more light source units may be provided on one or more sides of an LGP. According to an exemplary embodiment of the present invention, the backlight unit may be a direct-type backlight unit or another light source device, such as a surface-type light source device.

Each of the light source units may include a white light-emitting diode (LED) that emits white light, or LEDs that emit red (R) light, green (G) light, and blue (B) light. The light source units including LEDs that emit R light, G light, and B light, may realize white light by emitting the R light, G light, and B light together.

The upper substrate may be a color filter (CF) substrate. The upper substrate may include a black matrix (not illustrated) disposed on the bottom of a member formed of a transparent insulating material, such as glass or plastic, to prevent light leakage therefrom. The upper substrate may further include R, G and B color filters (not illustrated), and a common electrode (not illustrated) formed of a transparent conductive oxide such as indium tin oxide (ITO) or indium zinc oxide (IZO) that may generate electric field.

The liquid crystal layer configured to rotate the polarizing axis of incident light may be aligned in a predetermined direction and disposed between the upper substrate and the lower substrate. The liquid crystal layer may be of a twisted nematic (TN) mode, a vertical alignment (VA) mode, or a horizontal alignment mode (such as an in-plane switching (IPS) mode or a fringe field switching (FFS) mode) with positive dielectric anisotropy.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A polarizing plate, comprising:
   a substrate; and
   a conductive pattern layer comprising:
     a first pattern comprising line-shaped structures disposed at intervals with a period shorter than a wavelength of incident light to be isolated from one another, the first pattern configured to transmit first polarized light of the incident light therethrough and reflect second polarized light of the incident light that is perpendicular to the first polarized light; and
     a second pattern disposed on an outer boundary of the first pattern, the second pattern being isolated and insulated from the first pattern, the second pattern comprising a stem and at least one branch protruding from the stem toward the first pattern.

2. The polarizing plate of claim 1, wherein:
   the conductive pattern layer further comprises a third pattern configured to reflect the first polarized light and the second polarized light; and
   the third pattern is isolated and insulated from the second pattern.

3. The polarizing plate of claim 1, wherein the conductive pattern layer comprises a metal pattern layer.

4. The polarizing plate of claim 3, wherein the metal pattern layer comprises at least one of aluminum (Al), chromium (Cr), silver (Ag), copper (Cu), nickel (Ni), titanium (Ti), cobalt (Co), molybdenum (Mo), and an alloy thereof.

5. A thin-film transistor (TFT) substrate, comprising:
   a polarizing plate comprising:
     a polarizer configured to transmit first polarized light of incident light therethrough and reflect second polarized light of the incident light that is perpendicular to the first polarized light; and
     gate wiring disposed on an outer boundary of the polarizer; and
   data wiring disposed on the polarizing plate,
   wherein the polarizer and the gate wiring are disposed on the same layer.

6. The TFT substrate of claim 5, wherein the polarizer comprises a first pattern comprising line-shaped structures disposed at intervals having a period shorter than a wavelength of the incident light to be isolated from one another.

7. The TFT substrate of claim 5, wherein the polarizer is disposed in a pixel region surrounded by the gate wiring and the data wiring.

8. The TFT substrate of claim 6, wherein the gate wiring comprises at least one gate line and at least one gate electrode protruding from the gate lines toward the first pattern.

9. The TFT substrate of claim 5, wherein the polarizing plate further comprises a common electrode disposed on the outer boundary of the gate wiring.

10. The TFT substrate of claim 8, wherein:
    the polarizing plate further comprises a common electrode disposed on the outer boundary of the gate wiring; and
    the common electrode comprises:
      a common electrode line extending along a direction substantially parallel to the gate line; and
      a protrusion protruding from the common electrode line toward the first pattern.

11. The TFT substrate of claim 5, wherein the polarizing plate further comprises at least one reflective portion configured to reflect the first polarized light and the second polarized light.

12. The TFT substrate of claim 11, wherein the reflective portion is disposed between the gate lines and is insulated from the gate lines.

13. The TFT substrate of claim 11, wherein the reflective portion is disposed in a non-pixel region surrounding a pixel region.

14. A method of manufacturing a polarizing plate, the method comprising:
    forming a conductive layer on a substrate;
    forming a guide pattern layer on the conductive layer, the guide pattern layer comprising:
      a first guide pattern comprising first barriers and a half-tone region connected to the first barriers, the half-tone region covering the conductive layer; and
      a second guide pattern comprising second barriers exposing the conductive layer between the second barriers;
    forming a second pattern by patterning the conductive layer using the second guide pattern;
    forming a third guide pattern by removing the half-tone region;
    forming a nano-structure of a self-aligned block copolymer in trenches formed in the second pattern and the third guide pattern; and forming a first pattern by patterning the conductive layer using first domains or second domains of the self-aligned block copolymer, wherein:

the first pattern is configured to transmit first polarized light of the incident light therethrough and reflect second polarized light of the incident light that is perpendicular to the first polarized light;

the second pattern is disposed on outer boundaries of the first pattern, and is isolated and insulated from the first pattern; and the second pattern comprises a stem and at least one branch protruding from the stem toward the first pattern.

15. The method of claim 14, further comprising:

trimming widths of the first barriers and the second barriers.

16. The method of claim 15, wherein trimming the widths of the first barriers and the second barriers comprises using an oxygen ($O_2$) plasma etching process.

17. The method of claim 14, wherein forming the nanostructure of the self-aligned block copolymer comprises:

forming a block copolymer layer comprising first repeating units and second repeating units alternately disposed in the trenches; and annealing the block copolymer layer, wherein the first repeating units and second repeating units have different etching rates from each other.

18. The method of claim 17, wherein the block copolymer layer comprises at least one of polystyrene-b-polybutadiene (PS-b-PB), polystyrene-b-polyisoprene (PS-b-PI), polystyrene-b-poly(methyl methacrylate) (PS-b-PMMA), polystyrene-b-poly(2-vinylpyridine) (PS-b-P2VP), polystyrene-b-poly(ferrocenyl-dimethylsilane) (PS-b-PFDMS), polystyrene-b-poly(tert-butylacrylate) (PS-b-PtBA), polystyrene-b-poly(ferrocenylethylmethylsilane) (PS-b-PFEMS), polyisoprene-b-poly(ethyleneoxide) (PI-b-PEO), polybutadiene-b-poly(butadiene-b-vinylpyridinium) (PB-b-PVP), poly(tert-butylacrylate)-b-poly(cinnamoyl-ethylmethacrylate) (PtBA-b-PCEMA), polystyrene-b-polyactide (PS-b-PLA), poly(α-methylstyrene)-b-poly(4-hydroxystyrene) (PaMS-b-PHS), pentadecyl phenol modified polystyrene-b-poly(4-vinylpyridine) (PPDPS-b-P4VP), poly(styrene-b-ethyleneoxide) (PS-b-PEO), polystyrene-b-poly(dimethyl siloxane) (PS-b-PDMS), polystyrene-b-polyethylene) (PS-b-PE), polystyrene-b-poly(ferrocenyl dimethyl silane) (PS-b-PFS), polystyrene-b-poly(paraphenylene) (PS-b-PPP), PS-b-PB-b-PS, PS-b-PI-b-PS, poly (propyleneoxide))-b-PEO (PEO-b-PPO), poly(4-vinyl-phenyldimethyl-2-propoxysilane))-b-PI-b-PVPDMPS (PVPDMPS), PS-b-P2VP-b-PtBMA, and a block copolymer (BCP) thereof.

19. The method of claim 17, wherein annealing the block copolymer layer comprises thermal annealing or solvent annealing.

20. The method of claim 14, wherein forming the first pattern comprises:

removing one of the first domains or second domains disposed on the self-aligned block copolymer, the first domains being obtained by self-aligning first repeating units of the block copolymer layer, and the second domains being obtained by self-aligning second repeating units of the block copolymer layer; and patterning the conductive layer using one of the remaining first domains and second domains.

* * * * *